United States Patent [19]
Pezzani

[11] Patent Number: 5,969,922
[45] Date of Patent: Oct. 19, 1999

[54] FAILURE INDICATOR FOR A PROTECTION COMPONENT

[75] Inventor: Robert Pezzani, Vouvray, France

[73] Assignee: SGS-Thomson Microelectronics S.A., Saint Genis, France

[21] Appl. No.: 08/835,809

[22] Filed: Apr. 16, 1997

Related U.S. Application Data

[63] Continuation of application No. 08/422,593, Apr. 14, 1995, abandoned.

[30] Foreign Application Priority Data

Apr. 14, 1994 [FR] France .................................. 94 04759

[51] Int. Cl.$^6$ .......................... H01L 29/00; H01L 29/76
[52] U.S. Cl. ............................................. 361/56; 257/528
[58] Field of Search ........................................ 361/56, 119

[56] References Cited

U.S. PATENT DOCUMENTS

| | | | |
|---|---|---|---|
| 4,208,669 | 6/1980 | Silber et al. | 357/38 |
| 4,901,183 | 2/1990 | Lee | 361/56 |
| 4,907,119 | 3/1990 | Allina | 361/56 |
| 5,243,488 | 9/1993 | Bernier | 361/119 |

FOREIGN PATENT DOCUMENTS

| | | | |
|---|---|---|---|
| 0542648 | 5/1993 | European Pat. Off. | H01L 29/86 |
| 55-37640 | 3/1980 | Japan | 361/56 |

OTHER PUBLICATIONS

Patent Abstracts of Japan, vol. 8, No. 181 (E–261) Aug. 21, 1984 & JP–A–59072766 (Toshiba).

French Search Report from French Patent Application 94 04759, filed Apr. 14, 1994.

Primary Examiner—Stephen D. Meier
Attorney, Agent, or Firm—Wolf, Greenfield & Sacks, P.C.

[57] ABSTRACT

A failure detector associated with a four-layer semiconductor protection component has a middle layer that corresponds to a low-doped semiconductor substrate of a first conductivity type. The component includes in this substrate, in addition to plurality of regions providing its protection function, at least one additional region of the second conductivity type connected to a test terminal.

59 Claims, 3 Drawing Sheets

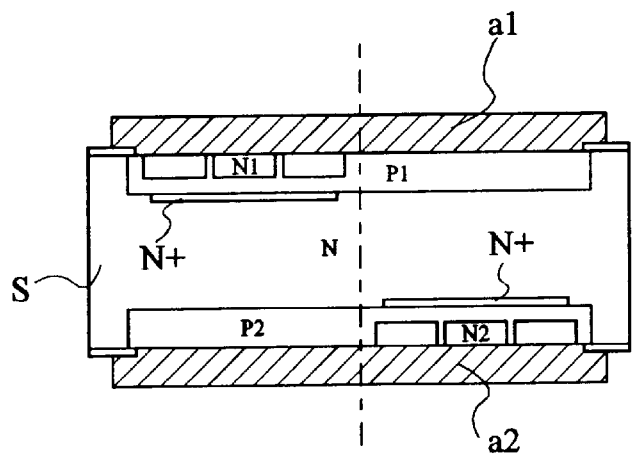
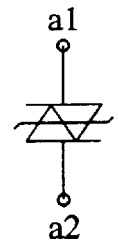
Fig 1A          Fig 1B
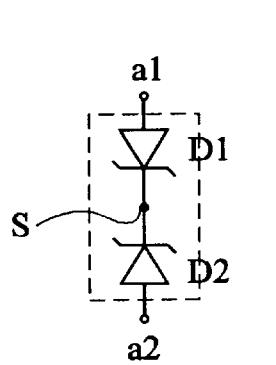
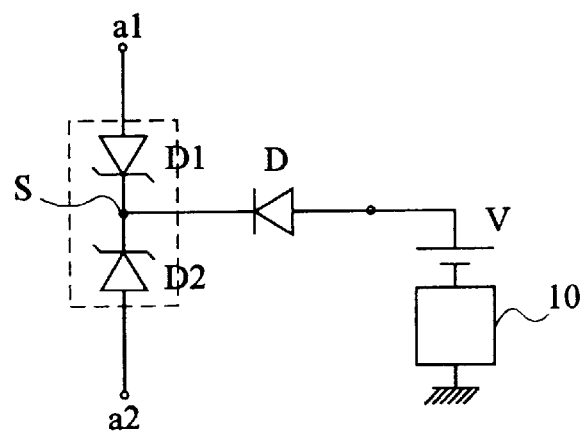
Fig 2A          Fig 2B
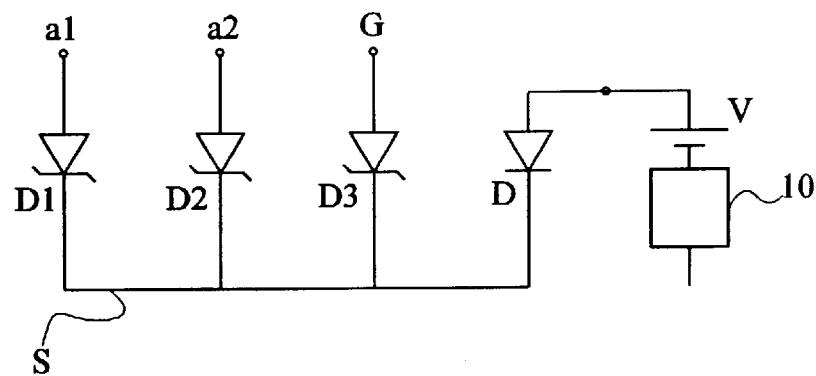
Fig 3

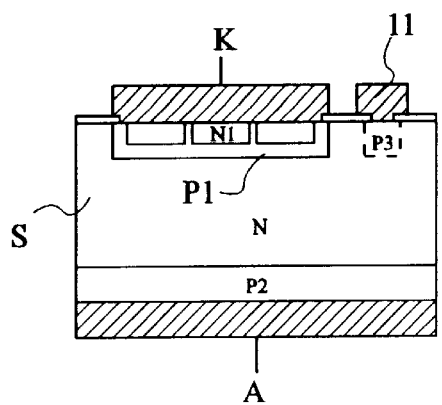 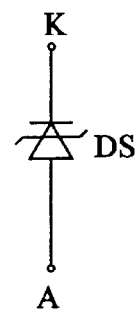 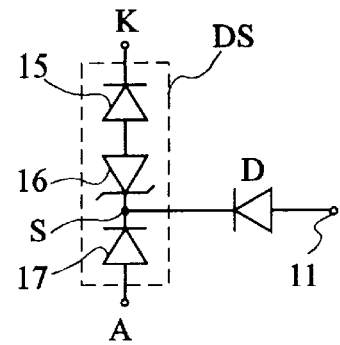
Fig 7A    Fig 7B    Fig 7C
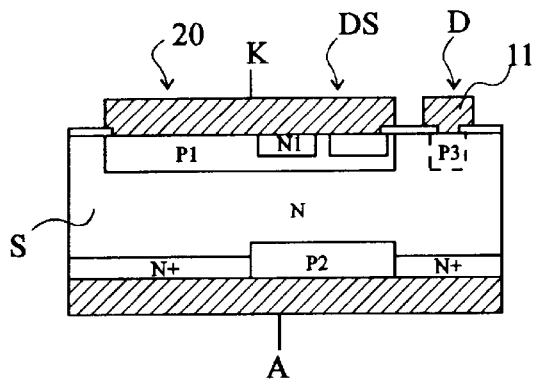 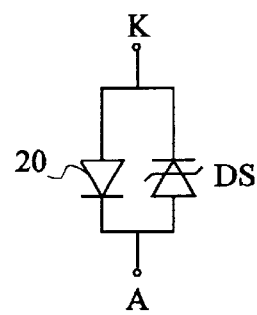
Fig 8A    Fig 8B
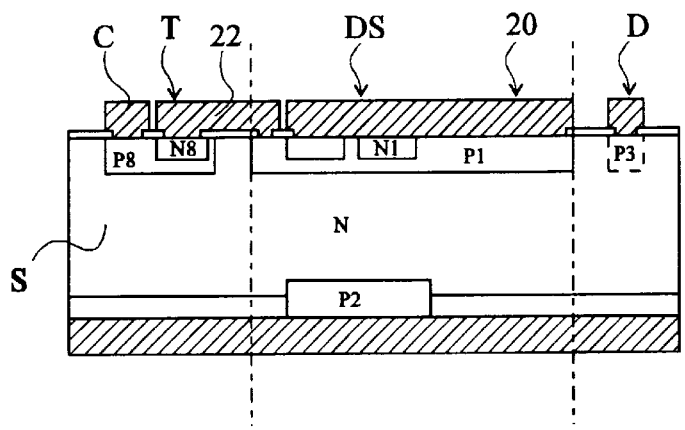 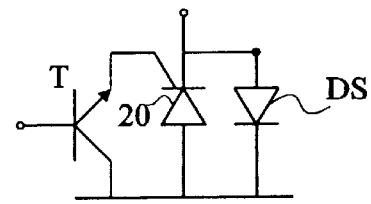
Fig 9A    Fig 9B

FAILURE INDICATOR FOR A PROTECTION COMPONENT

This application is a continuation of application Ser. No. 08/422,593, filed Apr. 14, 1995 now abandoned.

BACKGROUND OF THE INVENTION

1. Field of the Invention

The present invention relates to protection components including four alternate semiconductor layers, such as thyristors, gateless thyristors, and both mono and bidirectional Shockley diodes.

2. Discussion of the Related Art

Various circuits using such protection components and improvements of such components are described in the patents and patent applications U.S. Pat. No. 5,274,524, U.S. Pat. No. 5,243,488, EP-A-490,788, U.S. Pat. No. 5,272,363, EP-A-542,648, EP-A-561,721, and FR92/14,793 (B1712, B1713, B1731, B1810, B1841, B1958, B2072).

Various improvements have been made to such components to improve their protection function, that is, to increase the accuracy of their breakover threshold and/or to render the breakover threshold programmable, and to improve the reliability of the components. These protection components are increasingly used because of their switching-on characteristics (the voltage across their terminals drops to a very low value during the occurrence of an overvoltage), because of their subsequent small size, and because of their fast switching ability. These protection components are used in particular in the protection of telephone lines.

In a known way, one can use a one-way Shockley diode with a rectifying circuit, or a bidirectional Shockley diode mounted between two wires of a telephone line. One can use delta-connected or star-connected Shockley diodes, wherein a first terminal is connected to a first wire of the telephone line, a second terminal is connected to a second wire of the telephone line, and a third terminal is connected to a reference voltage, usually ground.

However, since the protection components must remain within tolerable size limits, these components are intended to withstand a predetermined maximum energy surge. Beyond this maximum energy surge, the protection component is at risk of being destroyed. The protection components are designed so that this destruction corresponds to a short-circuiting of the protection component. In fact, if destruction corresponded to an open circuiting of the component, the circuit to be protected could be destroyed.

SUMMARY OF THE INVENTION

An object of the present invention is to allow a simple and fast detection of the destruction of a four-layer protection component.

Destruction information can be provided in the immediate vicinity of the protection component, which is useful in telephone exchanges that receive a large number of lines. In such telephone exchanges, it is easy to immediately indicate on a control board whether the protection component associated with one of the lines is damaged so as to accelerate the maintenance operation.

The destruction failure information can also be sent to a remote control board.

A further object of the present invention is to allow a simple and fast detection of each switching on of a four-layer protection component.

To achieve these objects, the present invention provides for modifying a protection component by adding thereto an additional junction and for associating with the additional junction a biasing and detection circuit so that current may flow through the additional junction when one of the active junctions of the protection component is destroyed. The detection circuit then translates this current flow into an information signal, for example, a light signal using a Light-Emitting Diode (LED) or a signal remotely transmissible by a current detection circuit and an associated transmission circuit.

More particularly, the present invention provides a failure detector associated with a four-layer semiconductor proctection component, a middle layer of which corresponds to a low-doped semiconductor substrate of a first conductivity type. The protection component includes, in this substrate, in addition to the various regions providing its protection function, at least one additional region of a second conductivity type connected to a test terminal.

According to an embodiment of the invention, the test terminal is connected through a current detector to a voltage supply having a voltage that is either higher or lower than the quiescent voltage of each terminal of the component, depending on whether the substrate is of the N-type of P-type, respectively.

According to an embodiment of the invention, the protection component is a bidirectional Shockley diode including, on both sides of a substrate of first conductivity type, regions of the second conductivity type in which regions of the first conductivity type are formed, respectively. The regions of the first conductivity type are substantially complementary in projection. The additional regions are formed in the upper surface of the substrate at the same time that the region of the opposite conductivity type formed in the upper surface of the substrate.

According to an embodiment of the invention, the protection component includes layers adapted to form a plurality of delta-connected bidirectional Shockley diodes.

According to an embodiment of the invention, the protection components include layers adapted to form a plurality of star-connected bidirectional Shockley diodes.

According to an embodiment of the invention, the protection components include layers adapted to form one or more protection components having a controlled breakover voltage.

According to an embodiment of the invention, the current detector is a Light-Emitting Diode.

According to an embodiment of the invention, the defect detector is associated with circuitry for counting a number of surges.

The foregoing and other objects, features, aspects and advantages of the invention will become apparent from the following detailed description of the present invention when taken in conjunction with the accompanying drawings.

BRIEF DESCRIPTION OF DRAWINGS

FIG. 1A is a cross-sectional view of a semiconductor component forming a bidirectional Shockley diode;

FIG. 1B represents the symbol conventionally used to designate a bidirectional Shockley diode;

FIG. 2A is a schematic symbolic representation of the component of FIG. 1A;

FIG. 2B is a schematic diagram of the association of a failure detector according to the invention used with the component of FIG. 1A;

FIG. 3 is a schematic diagram of a failure detector according to the present invention used in a star connection or delta connection of bidirectional Shockley diodes;

FIG. 7A is a cross-sectional view of a one-way Shockley diode modified according to the present invention;

FIG. 7B represents the equivalent diagram of the circuit of FIG. 7A, not modified;

FIG. 7C represents another equivalent schematic of the circuit of FIG. 7A modified according to the invention;

FIG. 8A represents a circuit, modified according to the present invention, using a one-way Shockley diode with a parallel, head-to-tail connected diode;

FIG. 8B represents an equivalent diagram of the component of FIG. 8A before being modified according to the present invention;

FIG. 9A is a cross-sectional view of a component, modified according to the present invention, formed by a thyristor with a threshold controlled by a transistor and with a parallel, head-to-tail connected diode; and FIG. 9B represents an equivalent circuit of the component of FIG. 9A before being modified according to the present invention.

DETAILED DESCRIPTION

Figure 4:
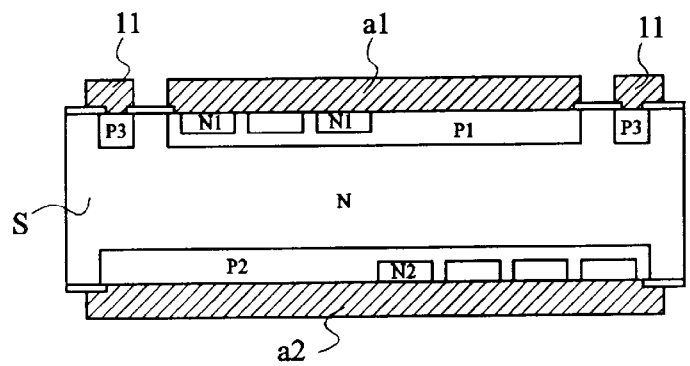
FIG. 4 is a cross-sectional view of a bidirectional Shockley diode modified according to the present invention.

FIG. 1A is a cross-sectional view of a conventional semiconductor component including a bidirectional Shockley diode. This component is formed from a substrate S of a first conductivity type, considered hereinafter as an N-type substrate. P-type regions, P1 and P2 are formed from the upper and lower surfaces of the substrate, respectively. An N-type region N1 is formed in approximately one half of the surface of region P1, and an N-type region N2 is formed in approximately one half of region P2. Regions N1 and N2 are substantially complementary when projected on a plane parallel to the main surface of the substrate. Regions N1 and N2 are conventionally perforated by shorting holes (emitter shorts). Regions N1 and P1 are coated with a metallization a1 and regions N2 and P2 are coated with a metallization a2. Non-referenced insulating layers, usually made of silicon oxide, are intended to limit contact between electrodes a1 and a2 and the substrate S. Usually, $N^+$ regions are disposed at the interfaces between regions P1 and P2 and the substrate S facing regions N1 and N2, respectively, to accurately determine the triggering threshold of the Shockley diodes.

The left part of FIG. 1A corresponds to a Shockley diode P2-S-P1-N1 whose metallization a2 constitutes the anode. The right part of FIG. 1A corresponds to a Shockley diode P1-S-P2-N2 whose metallization a1 constitutes the anode.

When electrode a1 is positive with respect to electrode a2, the junction $S(N^+)$-P2 constitutes the blocking junction which avalanches to insure a protection function when the voltage difference across electrodes a1 and a2 exceeds a predetermined threshold. Conversely, when metallization a2 is positive with respect to metallization a1, junction $S(N^+)$-P1 constitutes the blocking junction and avalanches when the voltage between electrodes a2 and a1 exceeds a predetermined threshold.

When an excessive positive overvoltage occurs on metallization a1, the junction between the substrate S and region P2 may be destroyed, that is, the junction may remain permanently conductive. Conversely, when an excessive positive overvoltage occurs on metallization a2, the junction between the substrate S and region P1 may be destroyed and therefore may remain permanently conductive.

It can be considered that the component of FIG. 1A in its quiescent state corresponds to the circuit of FIG. 2A which is constituted by two avalanche head-to-tail connected diodes D1 and D2. The first diode corresponds to junction P1-S and the second diode to junction S-P2. Of course, one should keep in mind that the component according to the present invention, when it begins to break over, does not have an avalanche diode function, but has a thyristor function, that is, the voltage across its terminals drops to a low value substantially lower than its breakover voltage. Thus, the circuit of FIG. 2A represents only very roughly the component of FIG. 1A. However, it will be used to describe the present invention. When the component of FIG. 1A is destroyed because of an overvoltage, as explained above, this corresponds to one of the avalanche diodes D1 and D2 short-circuiting.

The present invention provides, as illustrated in FIG. 2B, to connect the substrate S (which is the common junction of the cathodes of diodes D1 and D2) to the cathode of a detection diode D positively biased by a d.c. voltage source V in series with a current detector 10. The voltage supply V is selected to be positive with respect to the quiescent voltage of metallizations a1 and a2. For example, in the case where the bidirectional Shockley diode is intended to protect a telephone line, terminal a1 is at a voltage $-48$ V and terminal a2 is at a voltage, close to ground, usually slightly negative. Thus, it is sufficient that voltage V be slightly positive so that, if either one of the diodes D1 and D2 short circuits, current flows through diode D. This current is detected by detector 10 which may provide an alarm signal through a remote transmission circuit. In a simple circuit, detector 10 is a LED disposed in the immediate vicinity of the component to indicate an occurrence of the failure.

The polarities indicated above for diode D and the voltage source V depend upon the conductivity type of substrate S. When substrate S is of the P-type, diodes D1 and D2, as well as diode D, have polarities opposite that shown in FIG. 2B, and voltage V must be lower than the quiescent voltage of terminals a1 and a2.

To implement the present invention, a contact between the substrate and an external diode could be provided in the component of FIG. 1A.

According to an embodiment of the invention, diode D is integrated in the component of FIG. 1A as described hereinafter.

More generally the present invention applies to various types of circuits including at least one monolithic Shockley diode.

FIG. 3 represents a simplified equivalent circuit of the same type as that of FIG. 2A, including star-connected or delta-connected bidirectional Shockley diodes. The blocking junctions capable of avalanching correspond to Zener diodes D1, D2, and D3 that are disposed between terminals a1, a2, and G and substrate S. Diode D is connected to substrate S. Conventionally, terminal G is grounded. So, protection against an overvoltage occuring across terminals a1 and a2 or against an overvoltage occurring across one of these terminals and ground, is provided.

FIG. 4 is a schematic cross-sectional view of a bidirectional Shockley diode similar to that of FIG. 1A in which a diode according to the present invention is integrated. In this figure, the same elements as in FIG. 1A are designated with the same reference characters. Regions $N^+$ are shown. P-type regions P3 are formed in the upper surface of the substrate simultaneously with the region P1. These regions P3 form, with substrate S, the diode D. One or more regions P3 can be provided. Metallizations 11, integral with regions P3, correspond to the anode of diode D and constitute a test terminal that can be connected to a biasing and current detection circuit.

Figure 5:
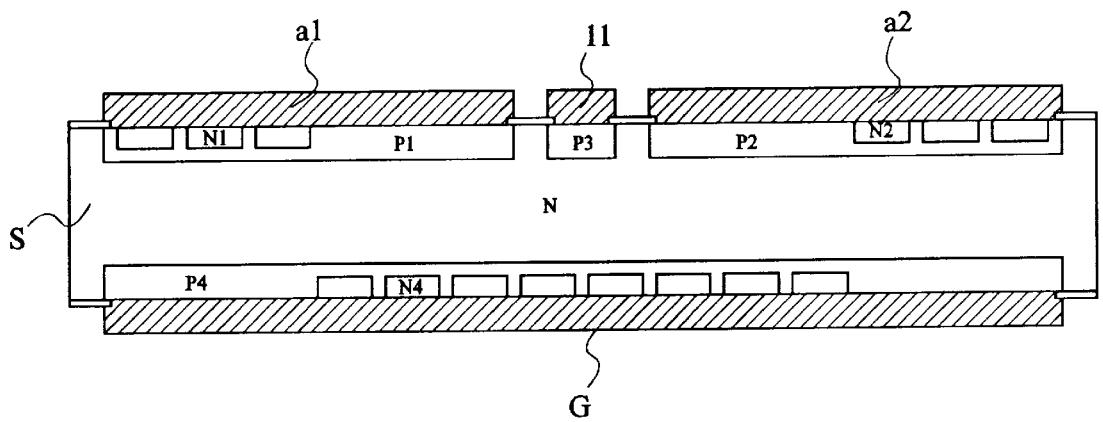
FIG. 5 represents a cross-sectional view of a component including a delta connection, modified according to the present invention, formed using bidirectional Shockley diodes.

FIG. 5 illustrates an application of the present invention to the construction of an array of delta-connected bidirectional Shockley diodes. Regions P1 and P2 are formed in the upper surface of the substrate. Region P4 is formed in the lower surface. Regions N1 and N2 occupy substantially one half of the upper surface of regions P1 and P2. A region N4 occupies substantially one half of the surface of region P4. Region N4 is substantially complementary with respect to the projection on a same plane of regions N1 and N2. A first vertical bidirectional Shockley diode is constituted by regions N1-P1-S-P4-N4 between metallizations a1 and G. A second vertical bidirectional Shockley diode is formed by regions N2P2-S-P4-N4 between metallizations a2 and G. A third lateral bidirectional Shockley diode is formed by regions N1-P1-S-P2-N2 between metallizations a1 and a2. The component according to the present invention further includes a region P3, similar to regions P1 and P2, formed in the upper surface of the substrate. Again, there can be provided several regions P3 distributed so that the access resistance between diode P3-S and the junction liable to have been destroyed, can be minimized.

Figure 6:
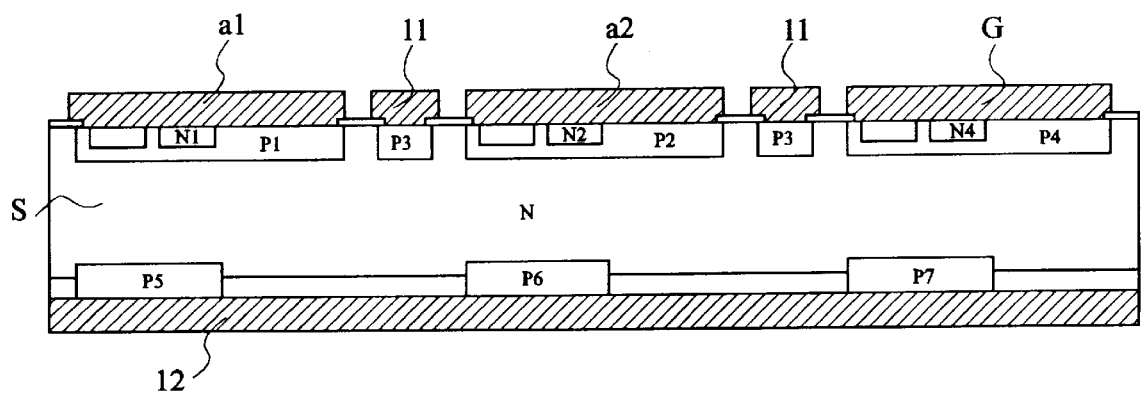
FIG. 6 represents a cross-sectional view of a component including a star connection, modified according to the present invention, formed using bidirectional Shockley diodes.

FIG. 6 represents a configuration with three star-connected bidirectional Shockley diodes. Three regions P1, P2, and P4 are formed in the upper surface of substrate S. Regions P5, P6, and P7 are formed facing regions N1, N2 and N4, formed in regions P1, P2, and P4, respectively. Each region N1, N2, and N4 occupies substantially one half of the surface area of each region P1, P2, and P4. The rear surface is coated with a metallization 12, non connected to an external electrode. Such a circuit has already been described in the above mentioned patents and patents applications. According to the present invention, diffused regions P3 are added in the upper surface of the substrate. These regions P3 form, with the substrate S, the diode D.

It should be noted that the present invention does not only apply to bidirectional Shockley diode circuits, but also to other four-layer protection circuits.

FIG. 7A represents a one-way Shockley diode constituted from an N-type substrate S, whose lower surface includes a P-type layer P2, and whose upper surface includes a P-type region P1 in which is formed an N-type region N1 which is conventionally perforated, like the preceding regions, by shorting holes. Region Nl is coated with a cathode metallization K, and the lower surface of region P2 is coated with an anode metallization A. The conventional symbol of such a one-way Shockley diode DS is shown in FIG. 7B. As represented in FIG. 7C, this Shockley diode can be considered as being constituted between its terminals K and A by a diode 15, corresponding to junction N1-P1, by an avalanche diode 16 corresponding to region P1-S, and by a diode 17 corresponding to junction S-P2. According to the present invention, a diode D, connected to the substrate S, is added. This diode D is constituted by a region P3 formed in the upper surface and integral with the test metallization 11.

In FIG. 8A, the four-layer component is a one-way parallel Shockley diode DS, head-to-tail connected to a diode 20. The upper surface of the N-type substrate S includes a P-type region P1, having substantially one half of its surface area occupied by an N-type region N1, provided with emitter shorts. On the rear surface, a region P2 is formed facing region N1, the remaining portion of the rear surface being an N-type ($N^+$) overdoped region. Thus, a one-way Shockley diode corresponding to regions P2-S-P1-N1 and a parallel head-to-tail connected diode formed by regions P1-N-$N^+$ are obtained. A P-type region P3 is formed in the upper surface to constitute with substrate S the diode D according to the present invention.

FIG. 9A corresponds to an implementation of the circuit illustrated in FIG. 9B. Its middle portion is substantially the same as the main portion of the component of FIG. 8A. Here, the four-layer circuit N1-P1-S-P2 constitutes a thyristor because a gate metallization 22 is integral with layer P1 and is connected to a region N8 which is formed in a well P8. Well P8 is connected to a control terminal C, which determines in a known way the avalanche triggering threshold of thyristor N1-P1-S-P2. A region P3 is formed in the upper surface of substrate S to constitute with the latter the diode D according to the present invention.

The above description only refers to exemplary embodiments of the present invention. The circuits of FIGS. 5 and 6 can be combined with the construction of the components of FIGS. 8 and 9. Also, more complex circuits including Shockley diodes or controlled breakover voltage thyristors can be formed on the same substrate S.

The failure detector according to the invention indicates the occurrence of a permanent failure, that is, the definitive shorting of a junction. Moreover, current flows through diode D during each occurrence of an over-voltage in the protection component. Thus, the detector according to the invention can be associated with a logic system which counts the number of triggering operations of the associated protection component, which can be useful to the monitoring of the circuit to be protected or of the line to which the circuit is connected. In fact, this can lead the maintenance staff to examine the type and frequency of failures and possibly to prevent these failures. Moreover, the fabrication of a logic circuit to analyze triggering is simplified since one of the terminals of the detector 10 can be connected to ground.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A failure detector integrated in a multi-region semiconductor protection component formed from a low-doped semiconductor substrate of a first conductivity type, wherein the multi-region semiconductor protection component includes in the substrate, in addition to regions providing its protection function, at least one additional region of a second conductivity type that is formed in a region of the multi-region semiconductor protection component having a lowest doping level of any region of the multi-region semiconductor protection component, the at least one additional region being connected to a test terminal to detect a destructive failure of the semiconductor protection component.

2. The failure detector of claim 1, further including a plurality of connection terminals each having a quiescent voltage, wherein the test terminal is connected to a current detector through a voltage source that provides a voltage that is greater than the quiescent voltage of each connection terminal when the first conductivity type is N-type, and that is less than the quiescent voltage of each connection terminal when the first conductivity type is P-type.

3. The failure detector of claim 1, wherein the multi-region semiconductor protection component is a bidirectional Shockley diode including, on each of a first and a second surface of the substrate, a region of the second conductivity type in which a region of the first conductivity type is formed, respectively, the regions of the first conductivity type being substantially complementary in projection, and wherein the at least one additional region and the region of the second conductivity type on the first surface are formed in the first side of the substrate at a same time.

4. The failure detector of claim 1, wherein the regions providing the protection function are adapted to form a plurality of delta-connected bidirectional Shockley diodes.

5. The failure detector of claim 1, wherein the regions providing the protection function are adapted to form a plurality of star-connected bidirectional Shockley diodes.

6. The failure detector of claim 1, wherein the regions providing the protection function are adapted to form at least one protection component having a controlled breakover voltage.

7. The failure detector of claim 2, wherein the current detector includes a light-emitting diode.

8. The failure detector of claim 2, further including a circuit, coupled to the current detector, that counts a number of surges through the semiconductor protection component.

9. A failure detector integrated in a semiconductor protection component, comprising:
a substrate of low-doped semiconductor material having a first conductivity type;
a plurality of semiconductor regions disposed in the substrate to form the semiconductor protection component; and
at least one additional region of the second conductivity type disposed in the substrate and forming a diode junction with the substrate, the at least one additional region, in combination with the substrate, forming the failure detector;
wherein the failure detector detects a destructive failure of the semiconductor protection component.

10. The failure detector of claim 9, further comprising:
a biasing source, coupled to the at least one additional region, that generates a biasing voltage to the at least one region; and
a current detector, coupled to the biasing source, that detects a forward conduction condition of the diode junction.

11. The failure detector of claim 10, wherein the first conductivity type is N-type and the second conductivity type is P-type.

12. The failure detector of claim 10, wherein the first conductivity type is P-type and the second conductivity type is N-type.

13. The failure detector of claim 9, wherein the semiconductor protection component is a bidirectional Shockley diode including a first protection region and a second protection region, the first and second protection regions each being of the second conductivity type and being disposed respectively at a first surface and a second surface of the substrate, each protection region including at least one sub-region of the first conductivity type.

14. The failure detector of claim 13, wherein the first surface and the second surface face each other, and wherein the protection regions are substantially complementary in projection.

15. The failure detector of claim 9, wherein the semiconductor protection component includes first, second, and third protection regions, each being of the second conductivity type and each including at least one sub-region of the first conductivity type, the semiconductor protection component forming a plurality of bidirectional delta-connected Shockley diodes.

16. The failure detector of claim 9, wherein the semiconductor protection component includes a plurality of protection regions of the second conductivity type, each including at least one sub-region of the first conductivity type, the semiconductor protection component forming a plurality of bidirectional star-connected Shockley diodes.

17. The failure detector of claim 9, wherein the plurality of semiconductor regions and the substrate are adapted to form at least one Shockley diode having a controlled breakover voltage.

18. The failure detector of claim 10, wherein the current detector includes a light-emitting diode.

19. The failure detector of claim 10, wherein the current detector includes a counting circuit that counts a number of forward conduction conditions of the diode junction.

20. An integrated circuit protection device, comprising:
at least four regions of semiconductor material,
a first region having a first conductivity type,
a second region, contiguous with the first region, having a second conductivity type,
a third region, contiguous with the second region, having the first conductivity type, and
a fourth region, contiguous with the third region, having the second conductivity type; and
at least one additional region, contiguous with the third region, to detect a permanently conductive state of a junction formed by the third and fourth regions, each at least one additional region being of the second conductivity type and forming a diode with the third region.

21. The integrated circuit protection device of claim 20, wherein each at least one additional region is not contiguous with any of the first region, the second region, and the fourth region.

22. The integrated circuit protection device of claim 20, wherein the at least one additional region is a plurality of additional regions coupled together to form an equivalent diode, and wherein the equivalent diode has a resistance that is less than a resistance of each individual diode of each additional region.

23. The integrated circuit protection device of claim 20, wherein the first conductivity type is one of a P-type and an N-type, and the second conductivity type is the other of the P-type and the N-type.

24. The integrated circuit protection device of claim 20, wherein the first region includes a plurality of sub-regions that extend through the first region, the plurality of sub-regions being of the second conductivity type and being continuous with the second region.

25. The integrated circuit protection device of claim 20, wherein the second region and the at least one additional region are disposed adjacently and non-contiguously at a common surface of the semiconductor protection device.

26. The integrated circuit protection device of claim 20, further comprising a fifth region, contiguous with the fourth region and of the first conductivity type, wherein the first through fifth regions form a bidirectional Shockley diode.

27. The integrated circuit protection device of claim 26, wherein the fifth region includes a plurality of sub-regions that extend through the fifth region, the plurality of sub-regions being of the second conductivity type and being continuous with the fourth region.

28. The integrated circuit protection device of claim 20, wherein the second region is a plurality of separate second regions each including a respective first region, each of the plurality of separate second regions being disposed in the third region and separated from one another by portions of the third region.

29. The integrated circuit protection device of claim 28, wherein at least one of the respective first regions includes a plurality of sub-regions of the second conductivity type, the plurality of sub-regions extending through the respective first region and being continuous with the respective second region.

30. The integrated circuit protection device of claim 28, wherein the plurality of separate second regions are disposed in the third region so that the integrated circuit protection device forms an array of delta-connected bidirectional Shockley diodes.

31. The integrated circuit protection device of claim 28, wherein the plurality of separate second regions are disposed in the third region so that the integrated circuit protection device forms an array of star-connected bidirectional Shockley diodes.

32. A device for protecting a telephone line against voltage surges, comprising:
a semiconductor protection device including at least four regions of semiconductor material,
a first region having a first conductivity type,
a second region, contiguous with the first region, having a second conductivity type,
a third region, contiguous with the second region, having the first conductivity type, and
a fourth region, contiguous with the third region, having the second conductivity type;
at least one additional region of the second conductivity type, contiguous with the third region and forming a diode with the third region, the diode detecting a permanently conductive state of a first reverse-biased junction formed between the second and third region;
a biasing circuit, coupled to each at least one additional region, that maintains a predetermined voltage at the at least one additional region; and
a current sensing device, coupled to the biasing circuit, that detects a forward biased current in the diode.

33. The device of claim 32, wherein the current sensing device includes a light-emitting diode coupled between the biasing circuit and a reference potential.

34. The device of claim 32, wherein the current sensing device includes a counting circuit that counts a number of instances that the diode conducts the forward biased current.

35. The device of claim 32, wherein a forward current is provided through the diode in response to one of a reverse breakdown of the first reverse-biased junction and a short-circuiting between the second and third regions.

36. The device of claim 35, wherein the semiconductor protection device further includes a fifth region contiguous with the fourth region and being of the first conductivity type, the first through fifth regions together forming a bidirectional Shockley diode.

37. The device of claim 36, wherein a second reverse-biased junction is formed between the third region and the fourth region, and wherein a forward current is provided through the diode in response to one of a reverse breakdown of the second reverse-biased junction and a short-circuiting between the third and fourth regions.

38. The device of claim 32, wherein the semiconductor protection component further includes a first terminal coupled to the first region and a second terminal coupled to the fourth region, and the telephone line has a first conductor and a second conductor, between which a voltage surge can occur, and wherein the first terminal and the second terminal are respectively coupled to the first conductor and the second conductor of the telephone line.

39. The device of claim 32, wherein the semiconductor protection component provides a substantial short-circuit between the first and the fourth regions in response to a sustained overvoltage condition.

40. The device of claim 32, further comprising an additional first region and an additional second region, the additional first region being contiguous with the additional second region, the additional second region being separated from the second region by portions of the third region so that the device forms a plurality of delta-connected Shockley diodes.

41. The device of claim 32, further comprising an additional first region and an additional second region, the additional first region being contiguous with the additional second region, the additional second region being separated from the second region by portions of the third region so that the device forms a plurality of bidirectional star-connected Shockley diodes.

42. A device for protecting a telephone line against voltage surges, comprising:
a semiconductor protection device including at least four regions of semiconductor material,
a first region having a first conductivity type,
a second region, contiguous with the first region, having a second conductivity type,
a third region, contiguous with the second region, having the first conductivity type, and
a fourth region, contiguous with the third region, having the second conductivity type;
rectifier means, contiguous with the third region, for conducting a current in a first direction between the rectifier means and the third region, the rectifier means detecting a permanently conductive state of a first reverse-biased junction formed between the second and third region;
a biasing circuit, coupled to the rectifier means, that maintains a predetermined voltage at the rectifier means; and
a current sensing circuit, coupled to the biasing circuit, that detects a current conducted by the rectifier means.

43. The device of claim 42, wherein the current sensing circuit includes a light-emitting diode coupled between the biasing circuit and a reference potential.

44. The device of claim 42, wherein the current sensing circuit includes a counting circuit that counts a number of instances that the rectifier means becomes conductive.

45. The device of claim 42, wherein a current is provided through the rectifier means in response to one of a reverse breakdown of the first reverse-biased junction and a short-circuiting between the second and third regions.

46. The device of claim 45, wherein the semiconductor protection device further includes a fifth region contiguous with the fourth region and having the first conductivity type, the first through fifth regions together forming a bidirectional Shockley diode.

47. The device of claim 46, wherein a second reverse-biased junction is formed between the third region and the fourth region, and wherein a current is provided through the rectifier means in response to one of a reverse breakdown of the second reverse-biased junction and a short-circuiting between the third and fourth regions.

48. The device of claim 46, wherein the semiconductor protection component has a first terminal coupled to the first region and a second terminal coupled to the fifth region, and the telephone line has a first conductor and a second conductor, between which a voltage surge can occur, and wherein the first terminal and the second terminal are respectively coupled to the first conductor and the second conductor of the telephone line.

49. The device of claim 48, wherein the semiconductor protection component provides a substantial short-circuit between the first conductor and the second conductor in response to a sustained overvoltage condition.

50. The device of claim 42, further comprising an additional first region and an additional second region, the additional first region being contiguous with the additional second region, the additional second region being separated from the second region by portions of the third region so that the device forms a plurality of delta-connected Shockley diodes.

51. The device of claim 42, further comprising an additional first region and an additional second region, the additional first region being contiguous with the additional second region, the additional second region being separated from the second region by portions of the third region so that the device forms a plurality of bidirectional star-connected Shockley diodes.

52. A method of detecting a destructive failure of a semiconductor protection component having at least four consecutive regions of alternating conductivity type, the method comprising the steps of:

generating a test current from the third region of the at least four consecutive regions in response to a current surge through the semiconductor protection component;

detecting the test currents;

indicating that the current surge through the semiconductor protection component has occurred; and continuing the steps of generating, detecting and indicating after the current surge has occurred when a junction between at least two of the at least four consecutive regions is destroyed.

53. The method of claim 52, wherein the step of generating includes generating a voltage at the third region in response to the current surge.

54. The method of claim 53, wherein the test current is generated in response to the voltage crossing a predetermined bias voltage.

55. The method of claim 54, wherein the test current is generated by forward biasing a diode.

56. The method of claim 52, wherein the step of indicating the current surge includes a step of activating a light-emitting diode.

57. The method of claim 52, further comprising a step of:

counting a number of instances that the test current is detected in the step of detecting.

58. An integrated circuit protection device, comprising:

at least four regions of semiconductor material,
a first region having a first conductivity type,
a second region, contiguous with the first region, having a second conductivity type,
a third region, contiguous with the second region, having the first conductivity type, and
a fourth region, contiguous with the third region, having the second conductivity type; and at least one additional region, contiguous with the third region, to detect a permanently short-circuited state of a junction formed by the third and fourth regions, each at least one additional region being of the second conductivity type and forming a diode with the third region.

59. The integrated circuit protection device of claim 58, wherein the at least one additional region further detects a transiently conductive state of the junction formed by the third and fourth regions.

\* \* \* \* \*